United States Patent
Shen

(10) Patent No.: US 7,950,447 B2
(45) Date of Patent: May 31, 2011

(54) HEAT DISSIPATION MODULE

(75) Inventor: Ching-Hang Shen, Kaohsiung (TW)

(73) Assignee: Asia Vital Components, Co. Ltd., New Taipei (TW)

( * ) Notice: Subject to any disclaimer, the term of this patent is extended or adjusted under 35 U.S.C. 154(b) by 769 days.

(21) Appl. No.: 11/936,791

(22) Filed: Nov. 8, 2007

(65) Prior Publication Data

US 2009/0120611 A1    May 14, 2009

(51) Int. Cl.
*F28F 7/00* (2006.01)
*H05K 7/20* (2006.01)

(52) U.S. Cl. .................................. 165/80.3; 165/104.21

(58) Field of Classification Search ................. 165/80.3, 165/185, 104.21, 104.33, 76; 361/700, 704; 257/715; 174/15.2, 16.3; 228/183

See application file for complete search history.

(56) References Cited

U.S. PATENT DOCUMENTS

| | | | | |
|---|---|---|---|---|
| 7,036,566 B1 * | 5/2006 | Huang | ...................... | 165/104.33 |
| 7,072,181 B2 * | 7/2006 | Fujiwara et al. | .............. | 361/700 |
| 2005/0066487 A1 * | 3/2005 | Zhang | .............................. | 24/457 |
| 2005/0145369 A1 * | 7/2005 | Huang et al. | ............. | 165/104.11 |
| 2005/0195569 A1 * | 9/2005 | Hsu | ................................. | 361/697 |
| 2007/0012428 A1 * | 1/2007 | Wu et al. | ................... | 165/104.33 |

FOREIGN PATENT DOCUMENTS

JP        2004241450 A    *    8/2004

* cited by examiner

*Primary Examiner* — Tho v Duong

(57) ABSTRACT

A heat dissipation module includes a cooling base, at least a guide heat pipe and a cooling fin set. The cooling base provides at least a circular recess and at least a receiving groove. The guide heat pipe is placed in the circular recess. The cooling fin set is joined to the cooling base and provides a lower folding side at each cooling fin thereof and the folding side has at least a concave upward portion corresponding to the circular recess. The receiving groove is disposed at two end sides of the circular recess for receiving solder, soldering paste, solder club or bonding agent. Therefore, when the cooling fin set and the guide heat pipe are joined to the cooling base, the receiving groove is capable of speeding up the joint and preventing abnormal phenomena such as incomplete soldering, creating clearance and excessive solder.

9 Claims, 8 Drawing Sheets

HEAT DISSIPATION MODULE

BACKGROUND OF THE INVENTION

1. Field of the Invention

The present invention is related to a heat dissipation module and particularly to a heat dissipation structure, which is capable of being fabricated speedily and joining the cooling fin set, the guide heat pipe and cooling base together tightly.

2. Brief Description of the Related Art

The integrated circuit provides a size getting smaller along with progress of semiconductor technology. In order to allow the integrated circuit being able to treat more data, multiple times of components can be received in an integrated circuit with the same size than before. More and more components being provided in the integrated circuit, more and more heat is generated. Taking the central processing unit (CPU) as an example, the heat generated by the CPU is sufficient to burn out the CPU itself in case of the full work load being performed. Hence, the heat dissipation device for the CPU is an important subject worth us to care.

Normally, the radiator is made of metallic material with high conductive coefficient of heat. In order to enhance effect of heat dissipation, mostly the cooling fin set is associated with the fan to perform the task of heat dissipation. Further, guide heat pipes are used to accelerate removal of the heat for preventing the integrated circuit product from being burned out.

It can be seen in FIGS. 1 and 2 that the conventional radiator A has a cooing base A1 with a circular groove A11 and the cooling fin set A3 has a lower folding side A31 with a concave upward portion A32.

When the radiator A3 is assembled, a section of the guide heat pipe A2 is placed in the circular recess A11 and the cooling fin set A3 is joined to the cooling base A1 in a way of the concave upward portion covering the section of the guide heat pipe A2 and the folding side A31 pressing downward against the cooling base A1. Hence, heat can be transmitted to the cooling fins of the cooling fin set via the cooling base A1 and the guide heat pipe A2 for promoting efficiency of heat dissipation.

Besides, another type of the cooling fin set does not provide the concave upward portion at the folding side such that a joining seat is equipped to have a circular upward recess for covering the guide heat pipe.

However, there are following deficiencies while the preceding conventional radiators are fabricated.

Generally, joint between metals mostly by way of soldering such that the cooling base A1, the guide heat pipe A2 and the cooling fin set A3 are soldered together. Hence, the guide heat pipe and the folding side of each cooling fin have to be welded to the cooling base A1. Because the cooling base has a flat top, it is easy to result in problems such as incomplete soldering, creating clearances, undesirable locating and excessive solder at the soldering spots. The problems leads to low guide heat efficiency between the cooling base A1 and the cooling fin set A3.

In addition, if the cooling paste is adopted, coating of the cooling paste is performed with the machine on the assembling line automatically and it is easy for the excessive coated cooling paste overflowing via the cooling base A1. Furthermore, frequently checking if the cooling paste is coated evenly is required in order to avoid degrading effect of heat dissipation.

SUMMARY OF THE INVENTION

In order to overcome the deficiencies of the preceding prior art, an object of the present invention is to provide a heat dissipation module which comprises a cooling base, at least a guide heat pipe and a cooling fin set; the cooling base provides at least a circular recess and at least a receiving groove; the guide heat pipe is placed in the circular recess; the cooling fin set is joined to the cooling base and provides a lower folding side at each cooling fin thereof and the folding side has at least a concave upward portion corresponding to the circular recess; and the receiving groove is disposed at two end sides of the circular recess for receiving solder, soldering paste, solder club or bonding agent. Therefore, when the cooling fin set and the guide heat pipe are joined to the cooling base, the receiving groove is capable of speeding up the joint and preventing abnormal phenomena such as incomplete soldering, creating clearance and excessive solder.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
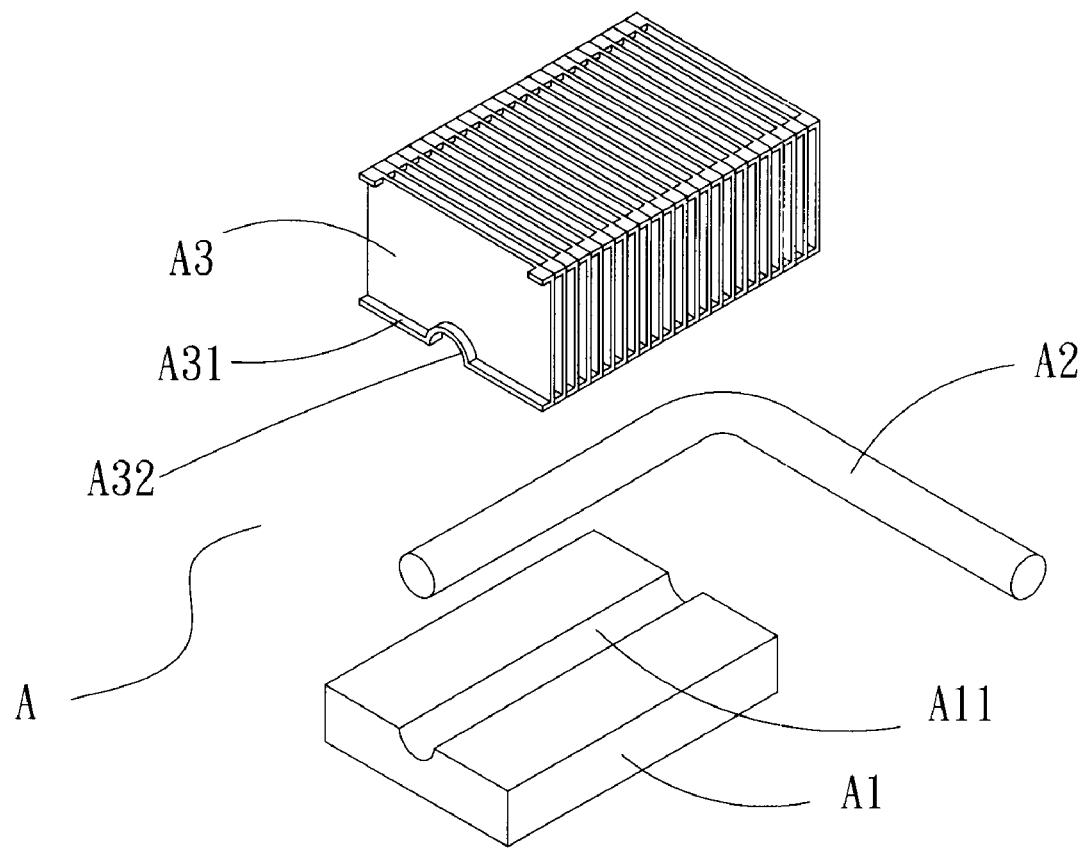
FIG. 1 is a disassembled perspective view of the conventional radiator.
Figure 2:
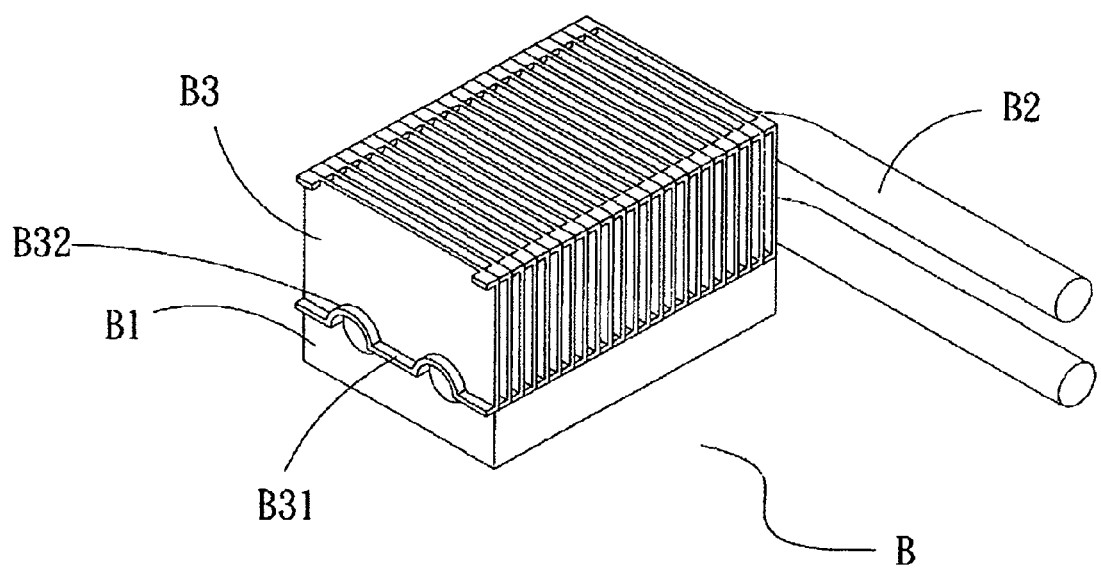
FIG. 2 is an assembled perspective view of a heat dissipation module according to a preferred embodiment of the present invention.
Figure 3:
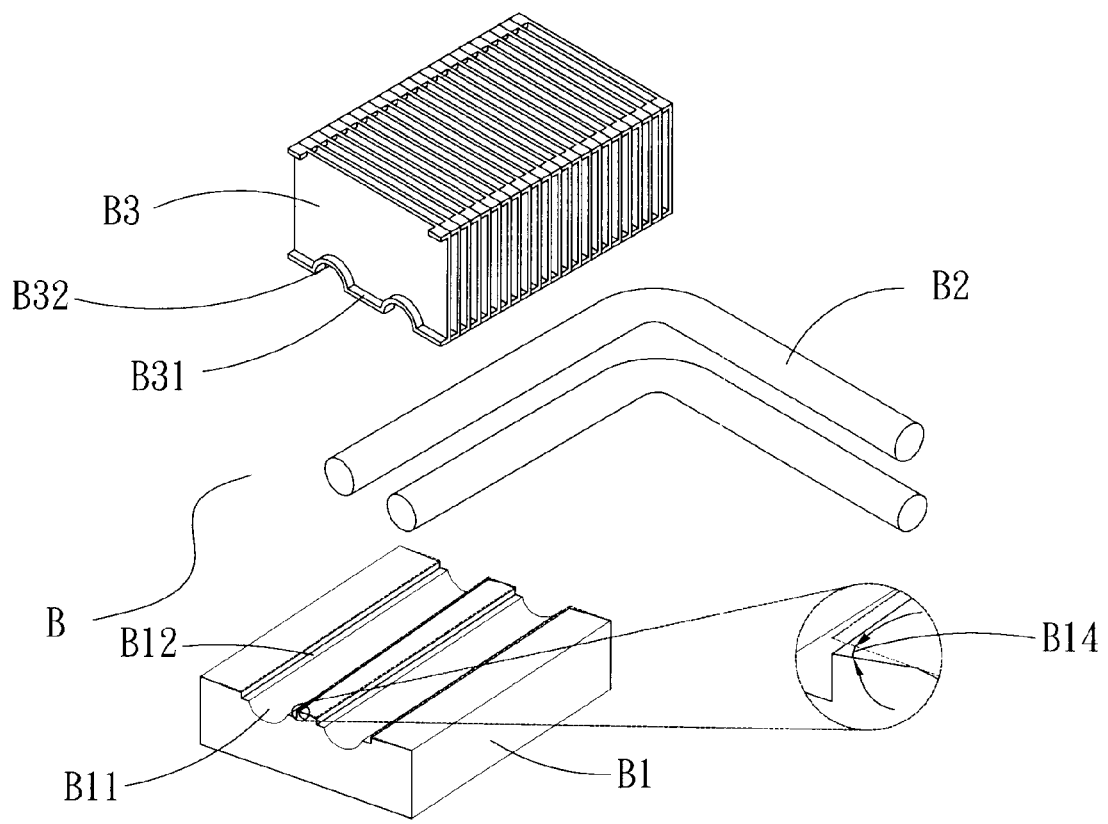
FIG. 3 is a disassembled perspective view of a heat dissipation module according to a preferred embodiment of the present invention.
Figure 4:
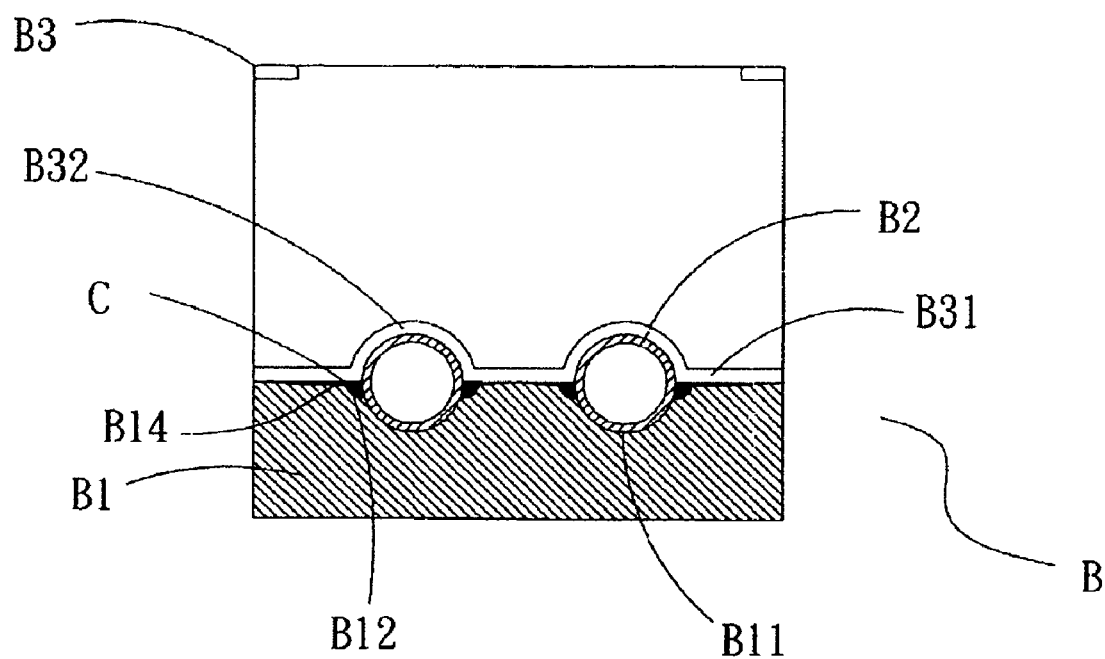
FIG. 4 is a sectional view of a heat dissipation module of the preferred embodiment shown in FIG. 2.

Referring to FIGS. 2 to 4, a heat dissipation module B according to the first preferred embodiment of the present invention includes a cooling base B1, two heat pipes B2 and a cooling fin set B3. Wherein, the cooling base B1 provides at least an elongated circular recess B11 and at least a receiving groove B12 extending along two elongated end sides of the circular recess B11. A slant surface B14 is provided on the cooling base B1 next to the respective end side of the circular recess B11. Each cooling fin of the cooling fin set B3 has a lower folding side B31 and the lower folding side has at least a concave upward portion B32.

When the preceding parts are assembled, the receiving groove B12 is filled with solder, solder club or soldering paste and the heat pipe B2 is placed in the recess B11. Then the cooling fin set B3 is placed on the heat pipe B2 and the cooling base B1 in a way of the concave upward portion B32 contacting with the heat pipe B2 and an inclining clearance being formed between the lower folding side B31 and the slant surface B14. When the heat dissipation module passes through a heater or a soldering stove in the process of being fabricated, the solder or soldering paste is melted such that the concave upward portion B32 of the lower folding side B31 can be joined to the heat pipe B2 and secured to the cooling base B1 firmly. The residue melted solder can fill in the inclining clearance between the lower folding side B31 and the slant surface B14. Thus, production speed of the heat dissipation module B can be enhanced and problems after the cooling base B1 is joined to the cooling fin set B3 such as incomplete soldering, creating clearance and excessive solder can be overcome advantageously.

Further, the receiving groove B12 can be placed with cooling paste additionally to accelerate heat conduction from the cooling base B1 and the cooling fin set B3 after the lower folding side B31 of the cooling fin set B3 and the cooling base B1 are bonded together tightly.

Figure 5:
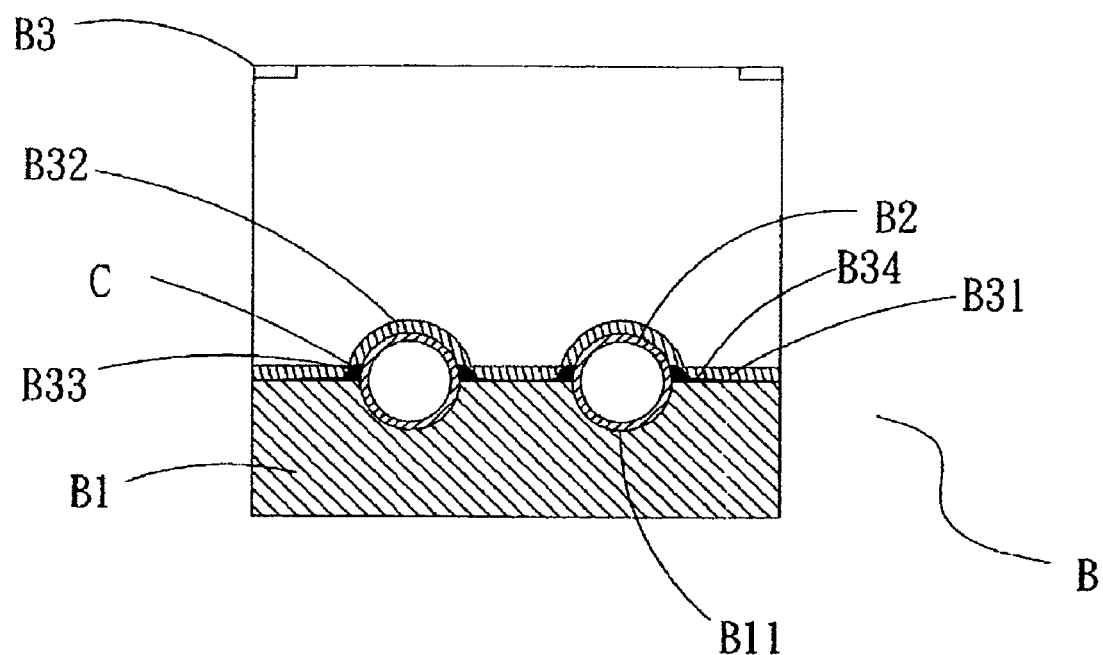
FIG. 5 is a sectional view of a heat dissipation module of another preferred embodiment according to the present invention.

Referring to FIG. 5, another embodiment of a heat dissipation module B according to the present invention is illustrated. The lower folding side B31 of each of the cooling fin of the cooling fin set B3 provides two receiving grooves B33 at two end sides of each concave upward portion B32 corresponding to the respective elongated circular recess B11 of the cooling base B1. Besides, the bottom of the lower folding side B31 has a slant surface B34 next to the respective receiving groove B33 facing the cooling base B1 instead of the slant surface B14 of the preceding embodiment such that a clearance C is formed between the slant surface B34 and the cooling base B1. The respective receiving groove B33 is placed with solder or soldering paste after the guide heat pipe is placed in the recess B11. In this way, production speed of the heat dissipation module B can be enhanced and problems after the cooling base B1 is joined to the cooling fin set B3 such as, incomplete soldering, creating clearance and excessive solder can be overcome as well.

Figure 6:
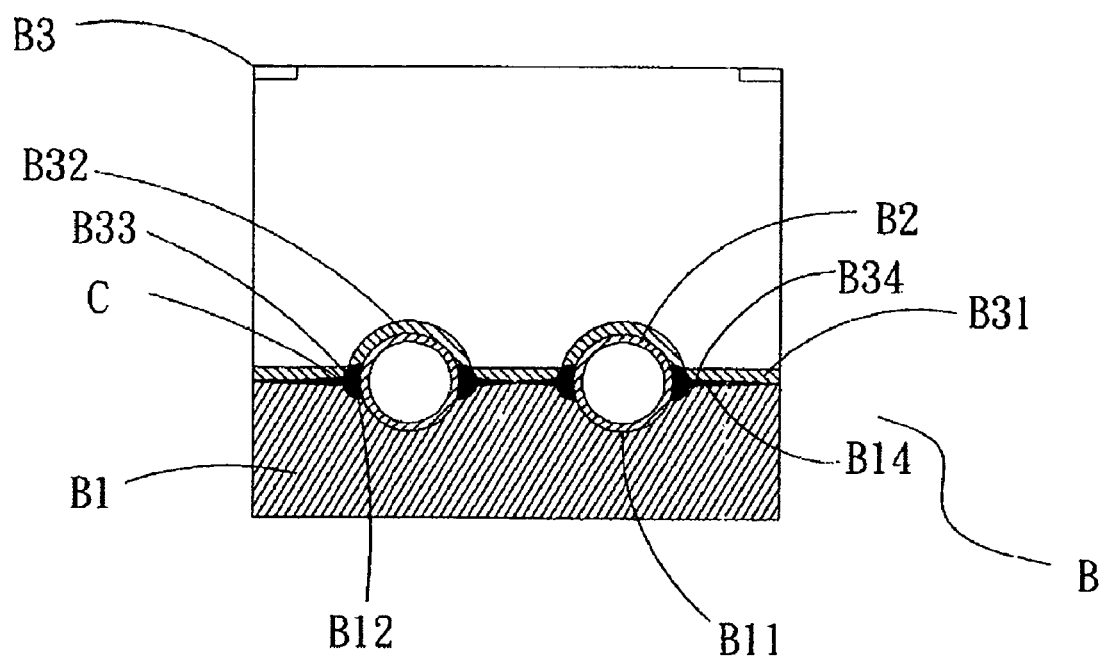
FIG. 6 is a sectional view of a heat dissipation module of a further preferred embodiment according to the present invention.

Referring to FIG. 6, a further embodiment of the heat dissipation module B according to the present invention is illustrated. The lower folding side B31 of the cooling fin set 3 and the cooling base B1 have receiving grooves B12, B33 respectively. The lower folding side B31 has slant surfaces B34 and the cooling base has slant surfaces B14 facing to each other. Thus, a clearance C can be formed between the slant surfaces B14, B34. The receiving grooves B12, B33 can be placed with cooling paste and solder or soldering paste such that problems after the cooling base B1 is joined to the cooling fin set B3 such as incomplete soldering, creating clearance and excessive solder can be overcome as well.

Figure 7:
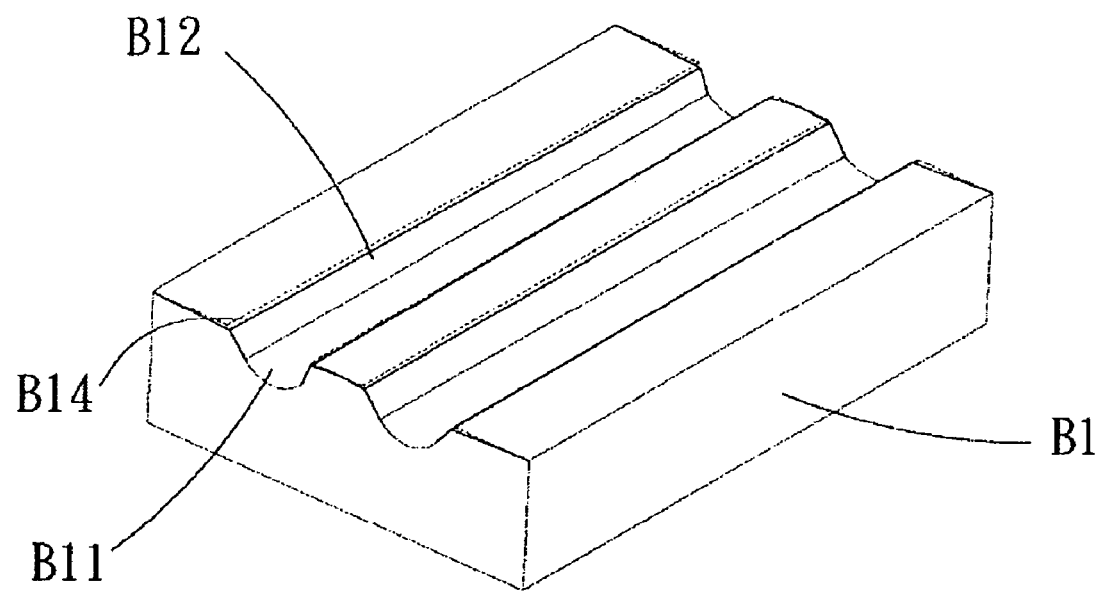
FIG. 7 is a perspective view of another configuration of the cooling base provided in the present invention.
Figure 8:
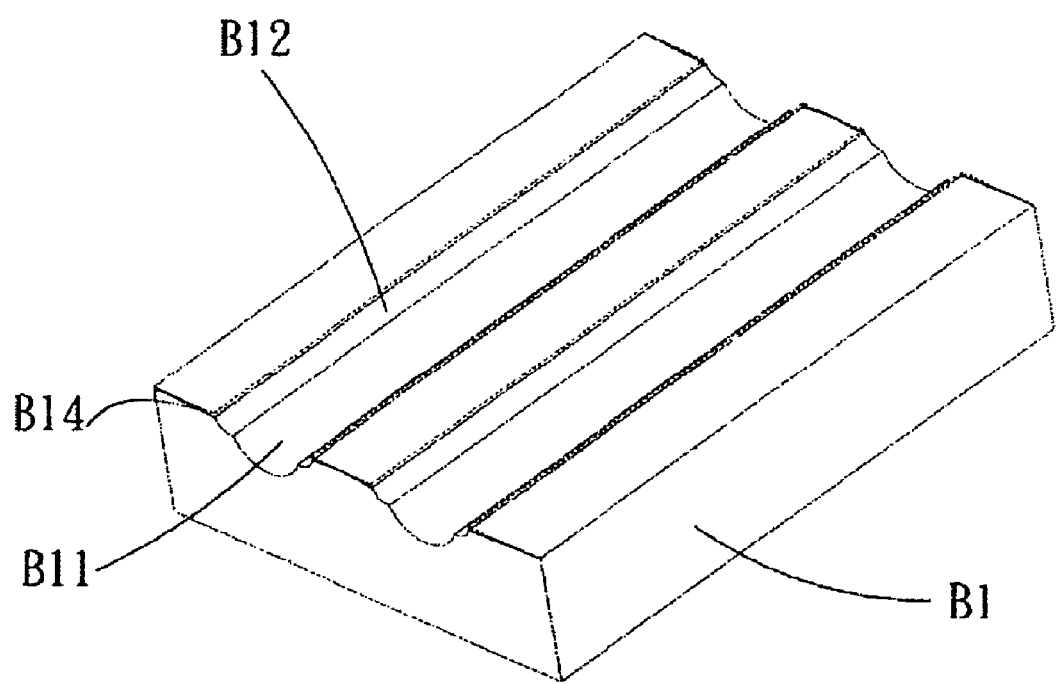
FIG. 8 is a perspective view of a further configuration of the cooling base provided in the present invention.

Referring to FIGS. 7 and 8, it can be seen clearly that the receiving groove B12 of the cooling base B1 can be provided with a shape of an inclining plane as shown in FIG. 7 or a curved plane shown in FIG. 8 in addition to an elongated angle shown in FIG. 3 the cooling base B1 having circular recesses B11 and the slant surfaces B14.

It is appreciated that the heat dissipation module according to the present invention has the following advantages. A plurality of receiving grooves B12 are provided at the cooling base B1 next to the circular recesses B11 and the folding side B31 of the cooling fin set B3 and the upper side of the cooling base B1 provide slant surfaces B34, B14 such that when the heat dissipation module B passes through a heater or a soldering stove in the process of being fabricated, the solder or soldering paste in the receiving grooves is melted. Thus, production speed of the heat dissipation module B can be enhanced and problems after the cooling base B1 is joined to the cooling fin set B3 such as incomplete soldering, creating clearance and excessive solder can be overcome effectively.

While the invention has been described with referencing to the preferred embodiments thereof, it is to be understood that modifications or variations may be easily made without departing from the spirit of this invention, which is defined by the appended claims.

What is claimed is:

1. A heat dissipation module comprising:
    a cooling base providing at least an elongated circular recess with two end sides and each of the two end sides has an elongated receiving groove extending along the respective end side;
    at least a guide heat pipe being placed in said circular recess; and
    a cooling fin set being joined to said cooling base, providing a plurality of cooling fins with a lower folding side disposed at the bottom of each of the cooling fins, and said folding side having a concave upward portion corresponding to said circular recess;
    wherein a slant surface is disposed on the cooling base next to the receiving groove respectively such that an inclining clearance is formed between the lower folding side and cooling base for filling a residue melted solder.

2. The heat dissipation module as defined in claim 1, wherein a solder, soldering paste, solder club or bonding agent is disposed in the respective receiving groove and melted to join said concave upward portion and said guide heat pipe to said cooling base, and the residue melted solder fills the inclining clearance respectively.

3. The heat dissipation module as defined in claim 1, wherein said first receiving groove provides a shape of angle, curve, inclining plane or the like.

4. A heat dissipation module comprising:
    a cooling base providing at least an elongated circular recess with two end sides;
    at least a guide heat pipe being placed in said circular recess;
    a cooling fin set being joined to said cooling base, providing a plurality of cooling fins with a lower folding side disposed at the bottom of each of the cooling fins, and said folding side having a concave upward portion corresponding to said circular recess, and two end sides of the concave upward portion having an receiving groove respectively;
    wherein a slant surface is disposed at the lower folding side next to the receiving groove respectively such that an inclining clearance is formed between the slant surface of the lower folding side and the cooling base for filling a residue melted solder.

5. The heat dissipation module as defined in claim 4, wherein a solder or soldering paste is disposed in the receiving groove respectively and melted to join said concave upward portion and said guide heat pipe to said cooling base, and the residue melted solder fills the inclining clearance respectively.

6. The heat dissipation module as defined in claim 1, wherein said receiving groove provides a shape of angle, curve, inclining plane or the like.

7. A heat dissipation module comprising:
    a cooling base providing at least an elongated circular recess with two first end sides with a first receiving groove being provided at the first end sides respectively;
    at least a guide heat pipe being placed in said circular recess;
    a cooling fin set being joined to said cooling base, providing a plurality of cooling fins with a lower folding side disposed at the bottom of each of the cooling fins, and said folding side having a concave upward portion with two second end sides corresponding to said circular recess, and the second end sides having a second receiving groove corresponding the first receiving groove respectively;
    wherein a first slant surface is disposed on the cooling base next to the first receiving groove, and a second slant surface is disposed at the bottom of the lower folding side next to the second receiving groove respectively such that a clearance is formed between the first and second slant surfaces for receiving a residue melted solder.

8. The heat dissipation module as defined in claim 7, wherein a cooling paste, and a solder or soldering paste are disposed in the receiving grooves respectively and melted to join said concave upward portion and said guide heat pipe to said cooling base, and the residue melted solder fills the clearance respectively.

9. The heat dissipation module as defined in claim 7, wherein said receiving grooves provides a shape of angle, curve, inclining plane or the like.

* * * * *